(12) United States Patent
Burt

(10) Patent No.: US 6,590,448 B1
(45) Date of Patent: Jul. 8, 2003

(54) OPERATIONAL AMPLIFIER TOPOLOGY AND METHOD

(75) Inventor: Rodney T. Burt, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/654,434

(22) Filed: Sep. 1, 2000

(51) Int. Cl.[7] .................................................. H03F 3/28
(52) U.S. Cl. ....................... 330/124 R; 330/51; 330/69; 330/107; 330/109; 330/124 D; 330/295; 257/207; 257/919
(58) Field of Search ................................ 257/919, 207; 330/51, 69, 107, 109, 124 R, 124 D, 295

(56) References Cited

U.S. PATENT DOCUMENTS

| | | | |
|---|---|---|---|
| 2,920,281 A | * | 1/1960 | Appert et al. ............ 330/124 R |
| 3,243,585 A | * | 3/1966 | Escobosa ................ 330/124 R |
| 3,348,163 A | | 10/1967 | Hirst |
| 3,525,948 A | * | 8/1970 | Sherer et al. ........... 330/124 R |
| 3,619,655 A | | 11/1971 | Cunningham |
| 3,963,993 A | | 6/1976 | Hoffman et al. |
| 4,263,559 A | | 4/1981 | Ho |
| 4,481,660 A | | 11/1984 | de Koning et al. |
| 4,598,252 A | | 7/1986 | Andricos |
| 4,755,769 A | | 7/1988 | Katz |
| 4,780,685 A | | 10/1988 | Ferguson |
| 4,893,093 A | | 1/1990 | Cronauer et al. |
| 5,155,447 A | * | 10/1992 | Huijsing et al. ............. 330/107 |
| 5,218,317 A | | 6/1993 | Boulzaguet et al. |
| 5,485,118 A | | 1/1996 | Chick |
| 5,604,460 A | | 2/1997 | Sehrig et al. |
| 5,712,591 A | * | 1/1998 | Maag et al. ............ 330/124 R |
| 5,801,407 A | * | 9/1998 | Yamada ....................... 257/207 |
| 5,821,824 A | | 10/1998 | Mentzer |
| 5,834,975 A | | 11/1998 | Bartlett et al. |
| 5,872,481 A | | 2/1999 | Sevic et al. |
| 5,923,213 A | | 7/1999 | Darthenay et al. |
| 5,982,230 A | | 11/1999 | MacBeth |

* cited by examiner

*Primary Examiner*—Michael B Shingleton
(74) *Attorney, Agent, or Firm*—W. Daniel Swayze, Jr.; W. James Brady; Frederick J. Telecky, Jr.

(57) ABSTRACT

A technique is disclosed which facilitates the layout of op amp cells, for example, two-stage op amp cells or three-stage op amp cells, to provide larger operational amplifiers. In accordance with one aspect, the op amp cells can be suitably coupled in parallel to provide a larger operational amplifier. This paralleling aspect can be facilitated by connecting the respective negative and positive inputs of a predetermined number of input $g_m$ stages together, connecting the outputs of a predetermined number of output $g_m$ stages together, and connecting a predetermined number of intermediate internal nodes between the input $g_m$ stages and the output $g_m$ stages together, without the occurrence of saturation of the internal nodes. In addition, the input and output characteristics of operational amplifier can be suitably improved. Further, the plurality of op amp cells can be selectively configurable to be connected in parallel with other op amp cells through the use of, for example, manual switches or other suitable electrical contacts, jumpers and the like, or programmable switches. Moreover, the op amp cells can be suitably configured in various arrangements, such as a two-stage cell having a first $g_m$ stage with a single-ended output, a two-stage cell having a first $g_m$ stage with a differential output, or a three-stage op amp cell. As a result, the method of the present invention can provide a substantial advantage in the design of integrated circuits in which the development costs are high, and multiple custom mask sets are too expensive to be practical.

26 Claims, 4 Drawing Sheets

OPERATIONAL AMPLIFIER TOPOLOGY AND METHOD

FIELD OF THE INVENTION

The present invention relates to an operational amplifier topology for use in integrated circuits. More particularly, the present invention relates to a method and circuit for providing an operational amplifier having selectively configurable input and output characteristics to optimize the performance of the operational amplifier.

BACKGROUND OF THE INVENTION

The demand for less expensive, and yet more reliable integrated circuit components for use in communication, imaging and high-quality video applications continues to increase rapidly. Integrated circuits have generally been comprised of two classes of products, merchant parts and custom layouts for products. The integrated circuit industry generally manufactures merchant parts in high volumes, and sells such products in competitive wide-application markets.

In addition to the merchant parts, the integrated circuit industry has also long provided integrated circuits for which "custom" integrated circuit mask layouts have been generated for each chip. However, these custom integrated circuits are relatively more expensive to design, layout and manufacture in that the integrated circuits are generally sold in lower volumes. For instance, the layout topography, i.e., the three-dimensional, layered configuration which embodies the miniature electronic circuits of an integrated circuit, has been painstakingly laid out to achieve multiple objectives in a custom layout. One objective includes the minimization of the chip size, i.e., the layout is designed to minimize the total dice area to the extent reasonably feasible. In addition to creating a full set of masks for these products, a full custom integrated circuit is typically designed component by component in a fashion analogous to the laying out of discrete components on printed circuit boards (PCBs). Thus, the layout topography is designed to facilitate the mounting of the completed integrated circuit chip into a predetermined package with a predetermined number of leads and lead locations. Further, the entire interconnect pattern must be developed within the layout topography to minimize interconnect conductor lengths which have parasitic capacities associated therewith and thus, to minimize cross-talk and various other detrimental parasitic effects.

Due to the above costs considerations in design and layout, cell-based application specific integrated circuits (ASICs) have been developed. In these applications, a large number of various standard integrated circuit "cells" can be formed on an integrated custom layer. These cell-based ASICs are generally designed with at least one dimension, e.g., the height, common to all the cells, and with the cells configured in rows similar to an array. As a result, very rapid, low cost design of a chip for a specific application can be realized. Such standard cells include various two-stage operational amplifier cells and three-stage operational amplifier cells.

With reference to FIG. 1, a prior art two-stage operational amplifier (op amp) 100, which can be a "standard cell" in a library of integrated circuit cells is illustrated. Two-stage op amp cell 100 is generally formed by retrieving in digital form, and strategically placing in an integrated circuit mask layout as part of the overall layout of an integrated circuit chip. Two-stage op amp cell 100 includes two amplifiers 102 and 106, which can be referred to as transconductance stages or $g_m$ stages, such as an input $g_m$ stage 102 and an output $g_m$ stage 106. In operation, input voltages $V_{in}^+$ and $V_{in}^-$ are suitably applied through conductors 103 and 104 to the negative (−) and positive (+) inputs, respectively, of input $g_m$ stage 102. The output of $g_m$ stage 102 is suitably connected by an internal node 105 to the negative (−) input of output $g_m$ stage 106, with the positive (+) input of the output $g_m$ stage 106 being connected to ground. The term "internal node" as used with reference to node 105 refers to a node that would saturate due to mismatches between input transistors and/or other components if multiple op amp cells were to be connected in parallel by bussing, i.e., connecting together, their corresponding input and output terminals together. In addition, output $g_m$ stage 106 includes an output 107 which is coupled through a compensation capacitor $C_{COMP}$ 108 in a feedback arrangement to internal node 105.

The use of a single two-stage amplifier is limited to a few applications due to limitations in power and its use at high frequencies. To overcome these power limitations, some techniques have attempted to provide for a parallel connection of a plurality of solid state amplifier elements, which each element sharing a portion of the amplification task. Theoretically, the total output power for such a configuration is equal to the product of the number of amplifier elements used and the power output of a single element.

Due to the above mentioned internal node saturation problem, it has been difficult and impractical to construct larger operational amplifiers by connecting a number of standard op amp cells in parallel simply by bussing their corresponding input terminals together and their corresponding output terminals together. Accordingly, while amplifier inputs have been bussed together in some applications, these connections generally have not been conducted within a single integrated circuit chip, but have utilized amplifier devices from several chips. In addition, such applications have required summing resistors, transformers, or other impedances, to connect the inputs or the outputs of the $g_m$ stages to the summing conductors. These resistors are generally configured within the bussing connections to absorb power resulting from mismatching of input and output components that are connected together. However, the use of summing resistors is impractical in an integrated circuit implementation because low resistance summing resistors require a great deal of chip area and hence are overly expensive to manufacture.

In another approach, some applications have comprised an ASIC methodology wherein in the maximum number of amplifier cells needed for any application would be configured in a custom layout, with multiple types of op amp cells incorporated to meet the required performance. For example, a quad operational amplifier layout has been utilized for providing a single or dual version of the same product. However, while the inclusion of the maximum number of op amp cells can address many of the performance needs, numerous op amp cells are not used in many applications, i.e., the unused op amp cells are not reconfigured for optimum performance.

Accordingly, a need exists for an operational amplifier topology that can facilitate the optimization of the input, output and layout characteristics of an operational amplifier. In addition, a need exists for an operational amplifier topology for facilitating the layout of operational amplifiers having various input and output characteristics that are readily configurable, rather than requiring a custom layout which needs the resizing of the input or output stages to meet a particular design performance criteria.

SUMMARY OF THE INVENTION

The method and circuit according to the present invention addresses many of the shortcomings of the prior art. In accordance with various aspects of the present invention, a technique is provided which facilitates the layout of op amp cells, for example, two-stage op amp cells or three-stage op amp cells, to provide larger operational amplifiers. In accordance with one aspect, the op amp cells can be suitably coupled in parallel to provide a larger operational amplifier. This paralleling aspect may be facilitated by connecting the respective negative and positive inputs of a predetermined number of input $g_m$ stages together, connecting the outputs of a predetermined number of output $g_m$ stages together, and connecting a predetermined number of intermediate internal nodes between the input $g_m$ stages and the output $g_m$ stages together, without the occurrence of saturation of the internal nodes. As a result, the current output of each $g_m$ stage can be suitably summed to provide the input to the next $g_m$ stage, with the summing occurring in locations within the operational amplifier in which saturation of the $g_m$ stages would typically otherwise occur due to mismatches of the components within the plurality of op amp cells if the op amps cells were simply joined together. Accordingly, the method of the present invention can provide a substantial advantage in the design of integrated circuits in which the development costs are high, and multiple custom mask sets are too expensive to be practical.

In accordance with another aspect of the present invention, the input and output characteristics of operational amplifier can be suitably improved. For example, for a plurality N of input $g_m$ stages configured with substantially the same characteristics, the input offset voltage and the noise of a composite operational amplifier comprising N op amp cells configured in parallel can be improved by a factor of approximately root N. In addition, for a plurality N of output $g_m$ stages configured with substantially the same characteristics, the output drive current and the output resistance of the composite operational amplifier can be improved by a factor of approximately N. Moreover, for other operational amplifier configurations including input $g_m$ stages and output $g_m$ stages having various different characteristics, other levels of improvement and results can be realized. As a result, the desired performance is readily configurable without the need for custom layouts of the operational amplifier.

In accordance with yet another aspect of the present invention, the plurality of op amp cells can be selectively configurable to be connected in parallel with other op amp cells through the use of switching arrangements, such as, for example, programmable or manual switches or other suitable electrical contacts, jumpers and the like.

In accordance with a further aspect of the present invention, the op amp cells can be suitably configured in various arrangements, such as a two-stage cell having a first $g_m$ stage with a single-ended output, a two-stage cell having a first $g_m$ stage with a differential output, or a three-stage op amp cell.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

Figure 1:
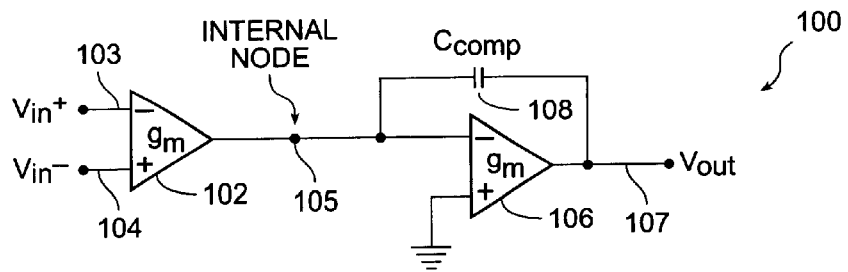
FIG. 1 illustrates a schematic diagram of a prior art two-stage operational amplifier cell configuration.

The present invention may be described herein in terms of various functional components and various processing steps. It should be appreciated that such functional components may be realized by any number of hardware or structural components.configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application where a single, dual, triple, quad or greater number of operational amplifier arrangements are desired. Such general applications that may be appreciated by those skilled in the art in light of the present disclosure are not described in detail herein. However for purposes of illustration only, exemplary embodiments of the present invention will be described herein in connection with two-stage or three-stage amplifiers. Further, it should be noted that while various components may be suitably coupled or connected to other components within exemplary circuits, such connections and couplings can be realized by direct connection between components, or by connection through other components and devices located therebetween.

As discussed above, prior art methods for providing custom operational amplifiers having various input and output characteristics have required custom layouts in which resizing of the input and output stages of the operational amplifier were required. In addition, due to the above mentioned internal node saturation problem, it has been difficult and impractical to construct larger operational amplifiers by connecting a number of standard op amp cells in parallel by bussing their corresponding input terminals together and their corresponding output terminals together. Moreover, the use of summing resistors to connect the inputs or the outputs of the $g_m$ stages to the summing conductors is impractical in an integrated circuit implementation because low resistance summing resistors require a great deal of chip area and hence are overly expensive to manufacture.

However, in accordance with various aspects of the present invention, a technique which facilitates the layout of op amp cells, for example, two-stage op amp cells or three-stage op amp cells, to provide effectively larger operational amplifiers, e.g., higher output current operational amplifiers, can be realized. In accordance with one aspect, the op amp cells can be suitably coupled in parallel to provide a larger operational amplifier. The paralleling aspect can be facilitated by connecting the respective negative and positive inputs of a predetermined number N of input $g_m$ stages together, connecting the outputs of a corresponding number N of output $g_m$ stages together, and connecting a corresponding number N of intermediate internal nodes between the input $g_m$ stages and the output $g_m$ stages together, all occurring without saturation of the internal nodes. In addition, the current output of each $g_m$ stage can be suitably summed to provide the input to the next $g_m$ stage, with the summing occurring in locations within the operational amplifier in which saturation of the $g_m$ stages would typically otherwise occur, i.e., the internal nodes, due to mismatches of the components within the plurality of op amp cells if the input and output terminals of the op amps cells were simply joined together.

As a result, the above techniques facilitate an improvement of the input characteristics of the op amp cell, e.g., the input offset voltage and the noise of a composite operational amplifier may be improved by a factor corresponding to the root N. In addition, the above techniques facilitate an improvement of the output drive characteristics, e.g., the output drive current and the output resistance of a composite operational amplifier may be improved by a factor corresponding to N. Moreover, this improvement is realized without saturation of the various $g_m$ stages.

Figure 2:
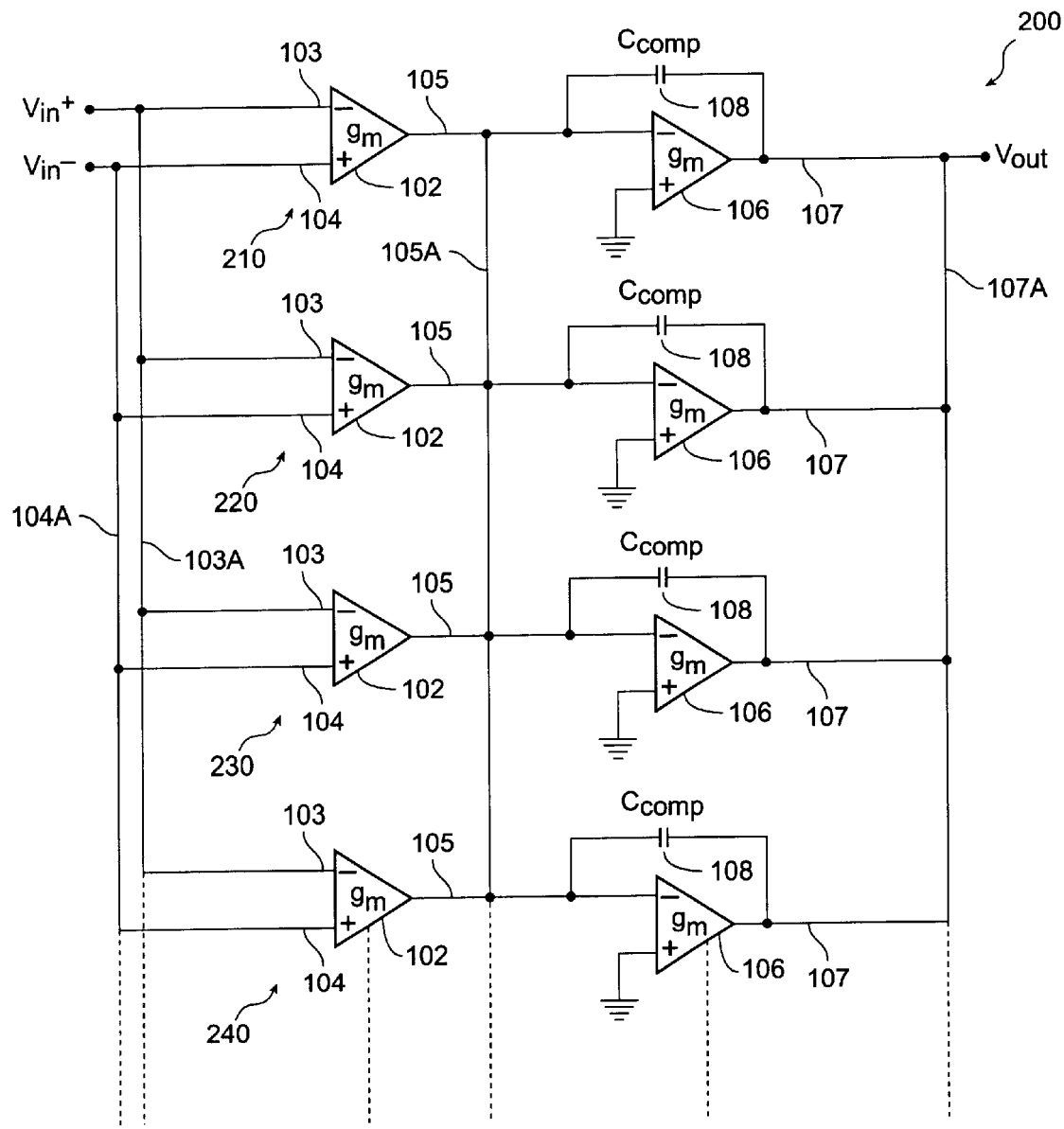
FIG. 2 illustrates a schematic diagram of an exemplary embodiment having multiple two-stage operational amplifiers configured in parallel in accordance with the present invention.

With reference to FIG. 2, an exemplary operational amplifier 200 comprises a plurality of two-stage op amp cells 100. For example, exemplary op amp 200 can comprise four op amp cells 100 configured with similar operating characteristics in a parallel arrangement to provide an operational amplifier which is substantially four (4) times as large as op amp cell 100, i.e., an operational amplifier which can provide substantially four times the output current, depending on the similarity of the operating characteristics of the op amp cells 100. In accordance with the exemplary embodiment, each of the negative (−) inputs 103 of the four input $g_m$ stages 210, 220, 230, and 240 are connected together by a conductor 103A to a positive input voltage $V_{in}^+$. Similarly, each of the positive (+) inputs 104 of input $g_m$ stages 210, 220, 230, and 240 are suitably connected by a conductor 104A to a negative input voltage $V_{in}^-$. In addition, output conductors 107 of the four output $g_m$ stages 106 are bussed together by a conductor 107A. Moreover, conductor 107A is configured to sum the respective output currents of the four output $g_m$ stages 106 to suitably produce an output voltage $V_{out}$.

In accordance with the present invention, to overcome the internal node saturation problem discussed above, it has been discovered that by connecting a corresponding number N of intermediate internal nodes between the input $g_m$ stages and the output $g_m$ stages together, the saturation problem of the internal nodes due to inherent mismatches between the input $g_m$ stages and the output $g_m$ stages of the op amp cells can be suitably avoided. In accordance with the exemplary embodiment, a conductor 105A is suitably configured to connect each of the intermediate nodes 105 of $g_m$ stages 210, 220, 230, and 240 together. Accordingly, the current output of each $g_m$ stage can be suitably summed to provide the input to the next $g_m$ stage without the occurrence of saturation between the various $g_m$ stages.

As a result, in addition to avoiding saturation of the internal nodes of the op amp cells, the above technique facilitates an improvement of the input characteristics, e.g., the input offset voltage and the noise of a composite operational amplifier, by a factor corresponding to the root N, and an improvement of the output drive characteristics, e.g., the output drive current and the output resistance of a composite operational amplifier, by a factor corresponding to N.

For example, for an exemplary operational amplifier 200 having four op amp cells 100 each configured with input $g_m$ stages having substantially the same, e.g., plus or minus 20%, operational characteristics, the input offset voltage and the noise of the composite operational amplifier 200 are decreased by a factor of approximately two. In addition, for an exemplary operational amplifier 200 having four op amp cells 100 each configured with output $g_m$ stages having substantially the same operational characteristics, the output drive current of operational amplifier 200 is increased by a factor of approximately four, while the output resistance of operational amplifier 200 is decreased by a factor of approximately four. Still further, because compensation capacitors $C_{COMP}$ 108 can be, in accordance with the present invention, scaled by a factor corresponding to N as well, the gain bandwidth (GBW) and the slew rate of the op amp cells are not adversely affected by the above embodiment. Moreover, compensation capacitors $C_{COMP}$ 108 can be suitably configured with different values to provide output $g_m$ stages 106 having different characteristics.

It should be noted that while various exemplary embodiments may include operational amplifier 200 having op amp cells 100 each configured with input $g_m$ stages, output $g_m$ stages, or both input and output $g_m$ stages having substantially the same operating characteristics, other exemplary embodiments can comprise various input $g_m$ stages, output $g_m$ stages, or both input and output $g_m$ stages having different operating characteristics. For example, for an exemplary operational amplifier 200 having four parallel op amp cells 100 each configured with output $g_m$ stages having different levels of drive current, such as one amp, two amps, four amps and eight amps, a resulting operational amplifier 200 could output 15 amps of drive current. As a result, other levels of improvement of performance, e.g., the input offset voltage, noise output drive current and resistance, corresponding the number N of op amp cells can be realized. Further, the desired performance is readily configurable without the need for custom layouts of the operational amplifier 200.

It should also be noted that although four (4) two-stage op amp cells 100 are suitably connected in parallel in the above exemplary embodiment, the dotted lines at the lower section of FIG. 2 indicate that any suitable number N of two-input op amp cells 100 can be suitably connected in parallel, with their respective internal nodes 105 being suitably connected together by conductor 105A. For example, two, eight, or sixteen or any other number of op amp cells 100 could be suitably configured in a parallel arrangement as described above depending on the desired input and output characteristics of the resulting operational amplifier.

In accordance with an exemplary embodiment of the present invention, conductors 103A, 104A, 105A and 107A may be formed of a patterned conductive material such as metal, e.g., aluminum-type alloys or any other conductive metal currently known or hereinafter devised. In accordance with this embodiment, forming of conductors 103A, 104A, 105A and 107A of patterned conductive metal allows for relatively easily configuration, for example the coupling or decoupling, of op amp cells 100 within operational amplifier 200. In addition, although summing resistors or large power ballasting resistors are not required for use with conductors 103A, 104A, 105A and 107A, such resistors or other impedances may be utilized in accordance with various embodiments of the present invention.

In accordance with another aspect of the present invention, although a composite operational amplifier can include a number N of op amp cells 100 suitably configurable for parallel connections, not all of the N number of op amp cells 100 need to be connected in parallel for operation.

For example, for an operational amplifier having four op amp cells 100, a suitable configuration could include the first, second and fourth op amp cells connected in parallel, the first and third op amp cells configured in parallel, or any other suitable arrangement depending on the desired input and output characteristics. The selection of which of the N number of op amp cells 100 are to be configured in parallel can be conducted during the manufacturing phase or during the operation phase through the use of a switching arrangement, such as manual switches or other suitable electrical contacts, jumpers and the like.

In addition, various of the input $g_m$ stages 102 can be suitably connected with various of the output $g_m$ stages 106, e.g., the first and third input $g_m$ stages 102 of operational amplifier 200 could be connected with the first, second and fourth output $g_m$ stages of operational amplifier 200 to provide a readily configurable device. In other words, not all of the input $g_m$ stages or all of the output $g_m$ stages have to be configured with their respective input and output terminals connected together. Moreover, not all of the input $g_m$ stages or all of the output $g_m$ stages have to be configured in a parallel arrangement with the other input and output $g_m$ stages. Accordingly, any other configuration of various input and output $g_m$ stages can be readily selected during manufacture, or via a switching arrangement.

Figure 5A:
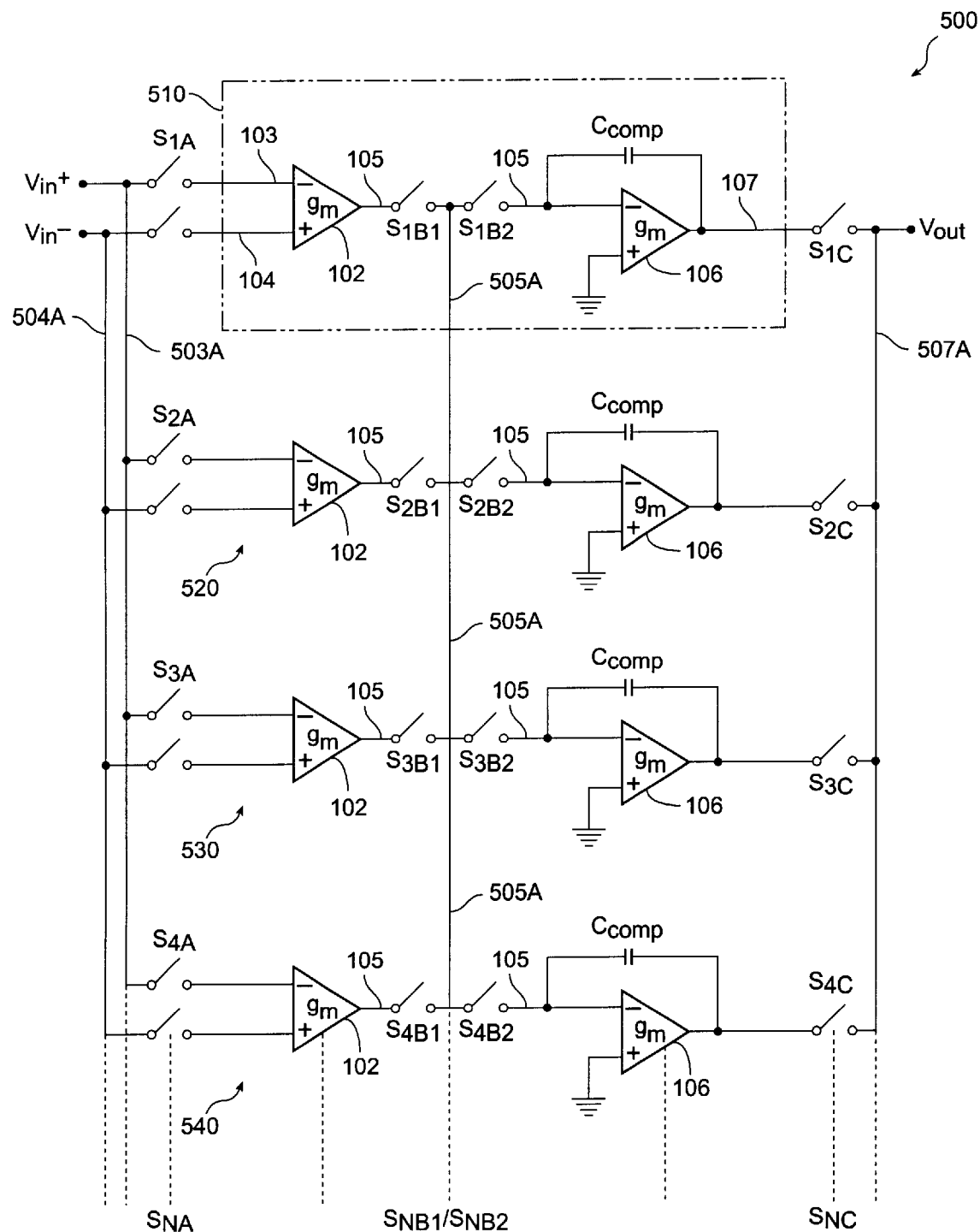
FIGS. 5A and 5B illustrate schematic diagrams of other exemplary embodiments having multiple two-stage operational amplifiers configured in parallel with switching arrangements in accordance with the present invention.

In accordance with an exemplary embodiment of operational amplifier 200 having a switching arrangement, with reference to FIG. 5A, an operational amplifier 500 having N number of op amp cells 100 can be configured by means of programmable switches $S_1$ through $S_N$ to form a programmable operational amplifier 500. For example, operational amplifier 500 can be configured such that each of the input bussing conductors 503A and 504A is connected to a predetermined number of negative (−) 103 and positive (+) 104 input terminals of the input $g_m$ stages 102 as desired by means of programmable switches $S_{1A}$ through $S_{NA}$ to form a programmable operational amplifier 500. In addition, the output characteristics of the composite operational amplifier 500 can be configured to be readily programmable by selectively connecting the internal nodes 105 to the internal conductor 505A as desired by means of programmable switches $S_{1B1}$ through $S_{NB1}$ and programmable switches $S_{1B2}$ through $S_{NB2}$.

In addition, when selectively disabling various input $g_m$ stages 102 and/or output $g_m$ stages 106 from operational amplifier 500, it is desirable to isolate those input $g_m$ stages 102 and/or output $g_m$ stages 106 from internal conductor 505A. Accordingly, the switching arrangement above operates to suitably isolate input $g_m$ stages 102 and output $g_m$ stages 106 from internal conductor 505A, and thus from operational amplifier 500 during operation. However, it should be noted that other methods for isolating input $g_m$ stages 102 and output $g_m$ stages 106 from operational amplifier 500 can be utilized as well. Similarly, the output characteristics, including, for example, the net amount of compensation capacitance $C_{COMP}$, in composite operational amplifier 500 can be readily programmable by suitably closing various of switches $S_{1C}$ through $S_{NC}$ to connect a predetermined number of the output conductors 107 to the output bus conductor 507A, as well as suitably closing various switches $S_{1B2}$ through $S_{NB2}$ to connect the inverting inputs of output $g_m$ stages 106 to internal conductor 505A.

In addition, switches $S_1$ through $S_N$ can comprise any switching devices, such as diodes, transistors or other suitably components now known or hereinafter devised for providing a switching function. Further, switches $S_1$ through $S_N$ can be suitably operated by any control device suitably configured for operating programmable switches. Still further, one or more control devices can be used to operate the various programmable switches, such as, for example, a single controller for the input $g_m$ stages, a single controller for the intermediate nodes, and a single controller for the output $g_m$ stages, or a single controller for all programmable switches. As a result, the total input and output characteristics can be readily configurable during operation of the operational amplifier 500.

Figure 5B:
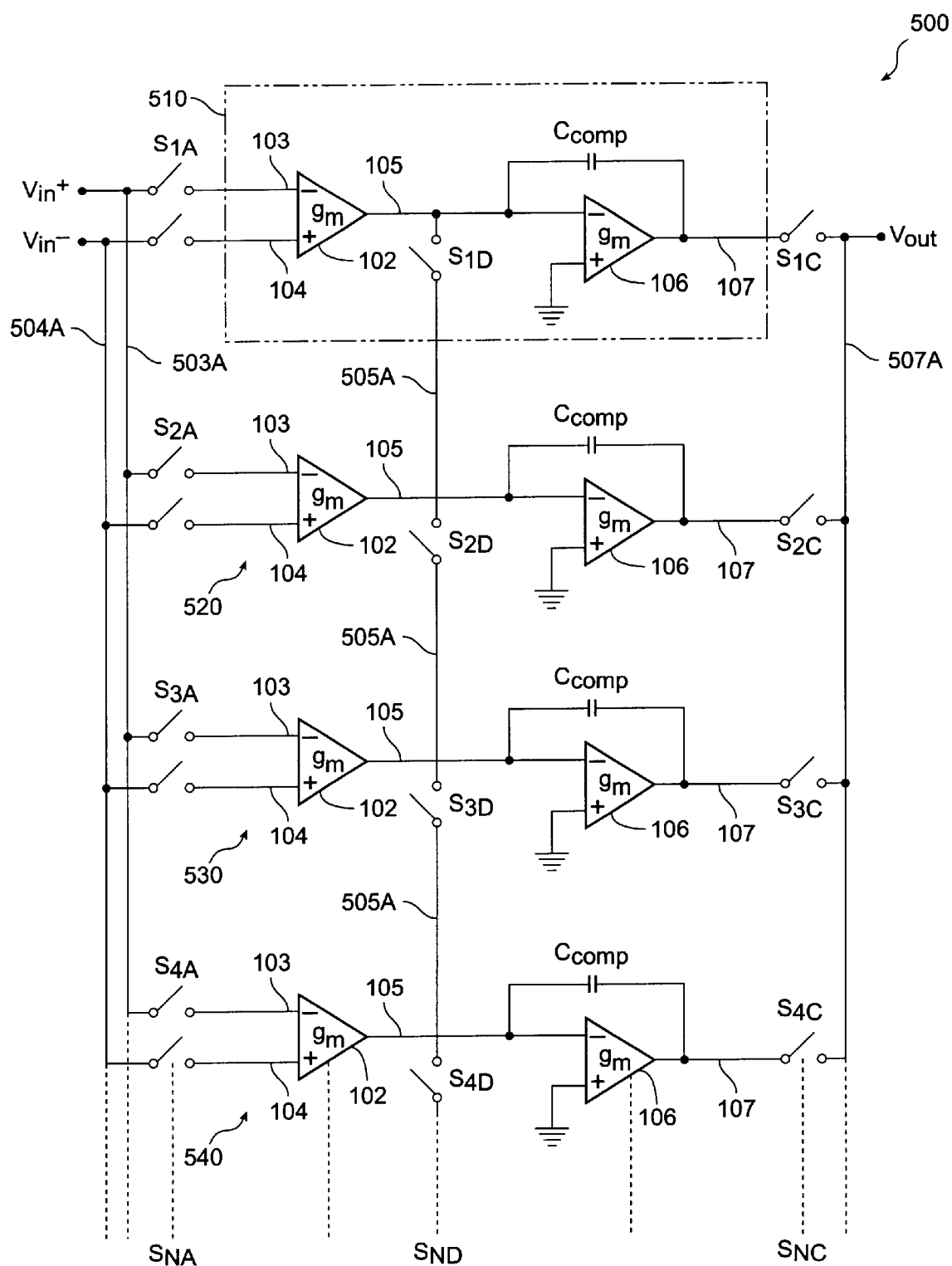

In accordance with other exemplary embodiments, while switches $S_{1B1}$ through $S_{NB1}$ and $S_{1B2}$ through $S_{NB2}$ are illustrated as being connected to various of input $g_m$ stages 102 and output $g_m$ stages 106 to selectively facilitate connection to internal conductor 505A, it should be noted that other arrangements can be provided. For example, with reference to FIG. 5B, additional switches $S_{1D}$ through $S_{ND}$ can be readily configured within an isolated, internal conductor 505A to selectively connect various internal nodes 105 of op amp cells together, for example internal node 105 of op amp cell 510 to internal node 105 of op amp cell 520. Moreover, switches $S_{1D}$ through $S_{ND}$ can be suitably configured with or without the use of switches $S_{1B}$ through $S_{NB}$ to provide a readily configurable operational amplifier 500.

Still further, instead of having a switching arrangement as illustrated in FIG. 5, operational amplifier 200 can be readily configurable by initially patterning a conductive material for conductors 105A, and then selectively etching out "open" portions as desired. Moreover, operational amplifier 200 can be readily configured such that each conductor 105A has open connections throughout as a result of the initial patterning of conductive material, and then selectively masking a conductive portion onto the open connections to "close" the electrical connection of conductor 105A.

In addition, it should be noted that the various $g_m$ stages 102 and 106 within composite operational amplifier 200 can be configured with different output characteristics, different valued compensation capacitors, or different resistive components or other devices, e.g., the various output $g_m$ stages may have different operational characteristics and may be suitably selected through a switching arrangement to provide a multitude of possible performance characteristics for an operational amplifier.

Figure 3:
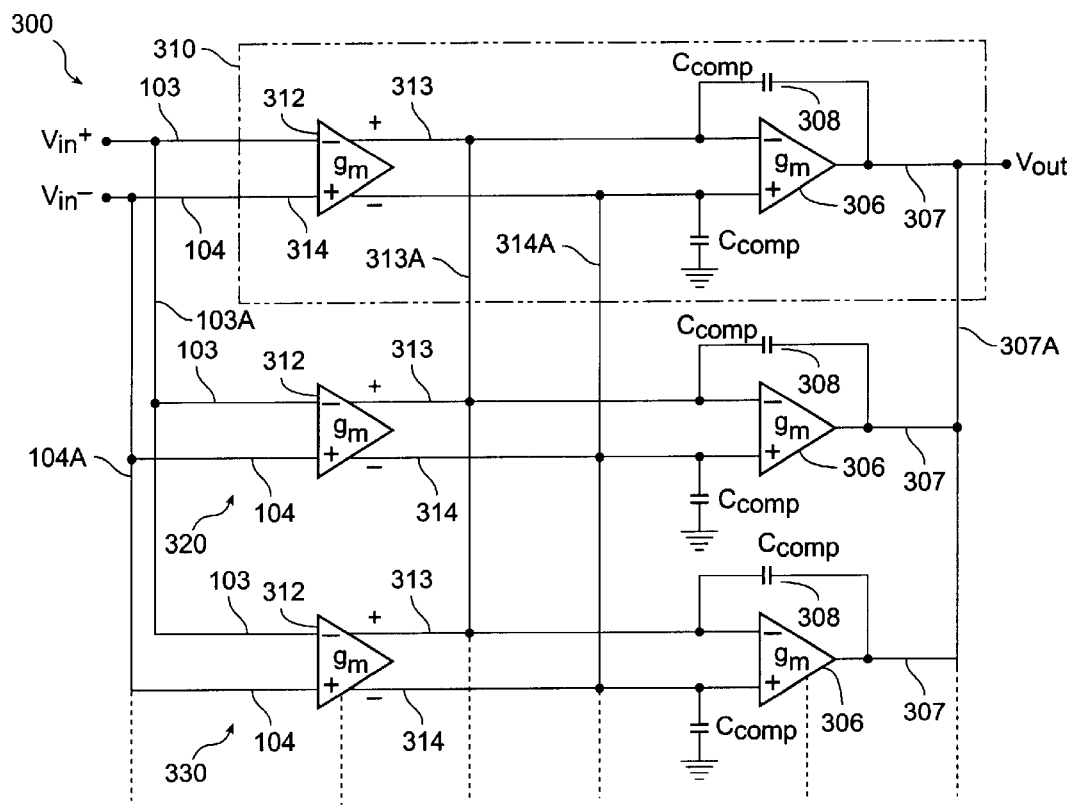
FIG. 3 illustrates a schematic diagram of an exemplary embodiment having multiple two-stage operational amplifiers having differential outputs configured in parallel in accordance with the present invention.

In accordance with another embodiment of the present invention, an op amp cell 100 can also be suitably configured to provide an input $g_m$ stage having a differential output stage, rather than a single ended output. For example, with reference to FIG. 3, an exemplary op amp cell 310 comprises an input $g_m$ stage 312 having differential outputs 313 and 314 suitably connected to the negative (−) and the positive (+) input terminals, respectively, of the output $g_m$ stage 306. In accordance with this embodiment, the positive (+) outputs 313 of input $g_m$ stages 312 can suitably produce output currents which can be summed in conductor 313A, while the negative (−) outputs 314 of input $g_m$ stages 312 can be suitably connected to a summing conductor 314A, which is suitably connected to the positive (+) inputs of output $g_m$ stages 306. As a result, the various current outputs can be summed by summing conductors 313A and 314A without the appearance of saturation between input $g_m$ stages 312 and output $g_m$ stages 306

It should be noted that any number N of two-stage op amp cells 310, for example, 320 and 330, comprising an input $g_m$ stage having a differential output stage can be configured in accordance with various embodiments of the present invention. In addition, as described above, two-stage op amp cells 310, 320 or 330 or more can be selectively configurable within the operational amplifier 300, such as by various switching arrangements, for example, manual switches or programmable switches, or other suitable electrical contacts, jumpers and the like.

Figure 4:
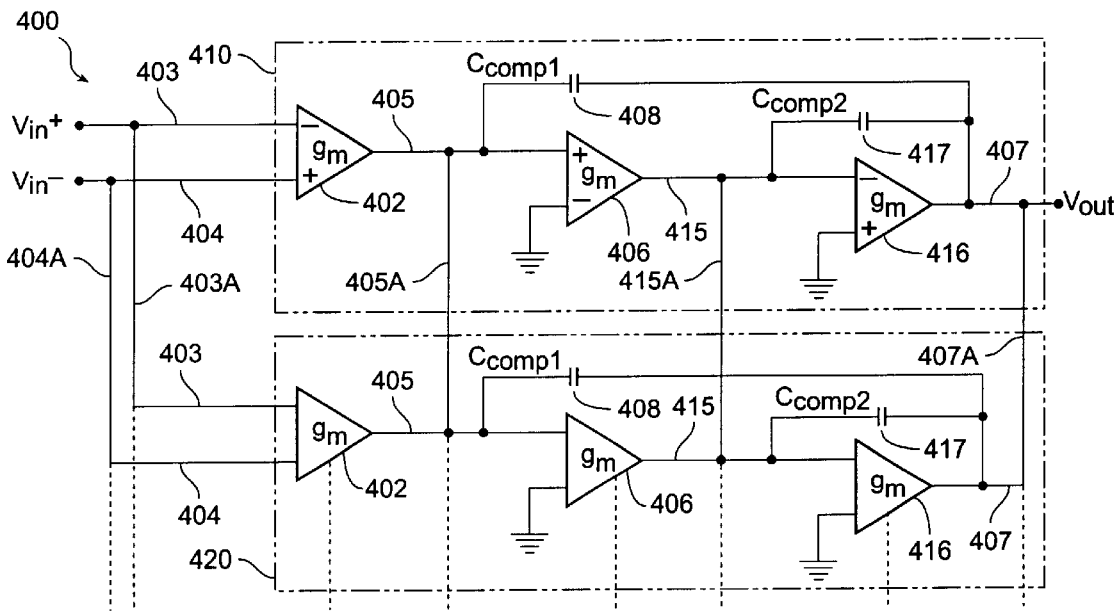
FIG. 4 illustrates a schematic diagram of an exemplary embodiment having multiple three-stage operational amplifiers configured in parallel in accordance with the present invention.

Although two-stage op amp cells have been described in more detail in accordance with various exemplary embodiments, the present techniques are also applicable with three-or-more-stage op amp cells. For example, with reference to FIG. 4, an exemplary operational amplifier 400 can comprise multiple three-stage op amp cells 410 having an input $g_m$ stage 402, a first subsequent $g_m$ stage 406, and a second subsequent $g_m$ stage 416. In accordance with an exemplary embodiment, the positive input voltage $V_{in}^+$ can be suitably connected to input conductors 403 of input $g_m$ stages 402, with each of input conductors 403 being connected to a bus conductor 403A. In addition, the negative input voltage $V_{in}^-$ can be suitably connected to input conductors 404 of input $g_m$ stages 402, with each of input conductors 404 being connected to a bus conductor 404A. Moreover, the internal output conductors 405 of input $g_m$ stages 402 can be suitably connected to a first internal node conductor 405A.

Each of three-stage operational amplifier cells 410 and 420 suitably includes a first subsequent $g_m$ stage 406 and a second subsequent $g_m$ stage 416. In addition, the output of first subsequent $g_m$ stage 406 may be connected to current output conductor 415 configured between first subsequent $g_m$ stage 406 and second subsequent $g_m$ stage 416. In accordance with this embodiment, current output conductors 415 are suitably bussed together by a second internal node conductor 415A. In addition, with respect to each second compensated $g_m$ stage 416 of the plurality of op amp cells 410, 420 or more, an output terminal 407 is suitably connected or bussed to a bus conductor 407A.

As a result, the current output of each $g_m$ stage is summed to provide the input to the next subsequent $g_m$ stage, with the summing function occurring in locations in which saturation of the $g_m$ stages would typically otherwise occur due to mismatches of the components within the op amp cells if the input and output terminals of the op amp cells were simply connected together. Moreover, the input and output characteristics of operational amplifier 400 are suitably improved as described above, e.g., the input offset voltage and the noise of composite operational amplifier 400 can be improved by a factor corresponding to approximately the root N, while the output drive current and the output resistance of composite operational amplifier 400 can be improved by a factor corresponding to approximately N.

It should be noted that while exemplary operational amplifiers 200, 300 and 400 can suitably include one or more integrated compensation capacitors $C_{COMP}$ within the subsequent $g_m$ stages or the output $g_m$ stages, the compensation function or device need not be integrated directly within the operational amplifier, e.g., the compensation function can be suitably provided by external circuitry.

In summary, a technique which facilitates the layout of op amp cells, for example, two-stage op amp cells or three-stage op amp cells, to provide larger operational amplifiers is disclosed. In accordance with one aspect, the current output of each $g_m$ stage can be suitably summed to provide the input to the next $g_m$ stage, with the summing function occurring in locations within the operational amplifier in which saturation of the $g_m$ stages would typically otherwise occur due to mismatches of the components within the plurality of op amp cells if only the input and output terminals of the op amp cells were paralleled together. As a result, the method of the present invention can provide a substantial advantage in the design of integrated circuits in which the development costs are high, and multiple custom mask sets are too expensive to be practical.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by providing other configurations of $g_m$ stages now known or hereinafter devised. Moreover, any number of op amp cells can be selectively configurable together in parallel. Further, although two-stage and three-stage op amp cells are illustrated above, any N-stage op amp cell configuration may be utilized in accordance with the present invention. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. A method for providing an operational amplifier having readily configurable input and output characteristics, said method comprising the steps of:

connecting in parallel a plurality N of op amp cells, each of said N op amp cells having an input $g_m$ stage, an output $g_m$ stage and an internal node thereinbetween, wherein said connecting step comprises directly connecting at least one of said internal nodes of said N op amp cells to at least one other of said internal nodes of said N op amp cells without the use of a summing resistor configured at an output of each said input $g_m$ stage;

summing a current output of at least one of said input $g_m$ stages of said N op amp cells with at least one other of said input $g_m$ stages of said N op amp cells; and providing said summed current output to at least one of said output $g_m$ stages of said N op amp cells, such that saturation due to mismatches between said N op amp cells is eliminated.

2. A method according to claim 1, wherein said step of connecting in parallel further comprises connecting at least one input terminal of said input $g_m$ stages to at least one input terminal of at least one other of said input $g_m$ stages.

3. A method according to claim 1, wherein said step of connecting in parallel further comprises connecting an output terminal of at least one output $g_m$ stages to an output terminal of at least one other of said output $g_m$ stages.

4. A method according to claim 1, wherein an input offset voltage and noise of said operational amplifier is improved by a factor corresponding to root N.

5. A method according to claim 1, wherein an output drive current and an output resistance of said operational amplifier is improved by a factor corresponding to N.

6. A method according to claim 1, wherein said step of connecting in parallel comprises the use of a switching arrangement to selectively connect said N op amp cells.

7. A method according to claim 6, wherein said switching arrangement comprises programmable switches.

8. A method according to claim 3, wherein said step of connecting an output terminal of at least one of said output $g_m$ stages to an output terminal of at least one other of said output $g_m$ stages is configured without use of a resistor element.

9. A method of operation for an operational amplifier comprising a plurality of cells configured in parallel and having desired input and output characteristics, said method comprising the steps of:

summing a current output of a first input $g_m$ stage of at least one of said plurality of cells with a current output of an input $g_m$ stage of at least one other of said plurality of cells, said step of summing performed without the use of a summing resistor; and providing said summed current output to a first subsequent $g_m$ stage of at least one of said plurality of cells, such that saturation due to mismatches between said plurality of cells is eliminated.

10. A method according to claim 9, wherein said step of summing said current output comprises directly connecting a first internal node located between said first input $g_m$ stage and a first subsequent $g_m$ stage of said at least one of said plurality of cells with another internal node located between another input $g_m$ stage and another first subsequent $g_m$ stage of at least one other of said plurality of cells.

11. A method according to claim 9, wherein said first subsequent $g_m$ stage comprises an output $g_m$ stage.

12. A method according to claim 9, wherein said first subsequent $g_m$ stage comprises a compensated $g_m$ stage.

13. A method according to claim 9, wherein said input $g_m$ stages comprise differential output stages connected to said first subsequent $g_m$ stages.

14. A method according to claim 10, wherein said step of summing said current output further comprises directly connecting a second internal node between said first subsequent $g_m$ stage and a second subsequent $g_m$ stage of said at least one of said plurality of cells with a second internal node between another first subsequent $g_m$ stage and another second subsequent $g_m$ stage of said at least one other of said plurality of cells.

15. A method according to claim 14, wherein at least one of said first subsequent $g_m$ stage and said second subsequent $g_m$ stage comprises a compensated $g_m$ stage.

16. A method for providing an operational amplifier having readily configurable input and output characteristics, said method comprising the steps of:

connecting respective negative and positive inputs of a predetermined number of input $g_m$ stages together;

connecting outputs of a predetermined number of output $g_m$ stages together; and connecting a predetermined number of intermediate internal nodes between said input $g_m$ stages and said output $g_m$ stages together without the occurrence of saturation of the internal nodes, wherein said step of connecting a predetermined number of intermediate internal nodes is performed without the use of a summing resistor.

17. A method according to claim 16, wherein at least one of said steps of connecting comprises the use of a switching arrangement to selectively connect at least one of said respective negative and positive inputs, said outputs, and intermediate internal nodes together.

18. An operational amplifier topology for providing a readily configurable operational amplifier, said topology comprising:

a plurality of operational amplifier cells, each said operational amplifier cell comprising:

a first $g_m$ stage having input terminals and a current output;

an internal node; and at least one subsequent $g_m$ stage having an input terminal and an output terminal, said input terminal being configured for connection to said current output through said internal node; and wherein said plurality of operational amplifier cells are configurable in a parallel arrangement to eliminate saturation due to mismatches between said operational amplifier cells by directly connecting at least two of said internal nodes of said operational amplifier cells together without the use of a summing resistor configured with each said current output of said first $g_m$ stages of said plurality of operational amplifier cells.

19. An operational amplifier topology according to claim 18, wherein said plurality of operational amplifier cells are configurable in a parallel arrangement by connecting said input terminals of at least two of said first $g_m$ stages of said operational amplifier cells together.

20. An operational amplifier topology according to claim 18, wherein said plurality of operational amplifier cells are configurable in a parallel arrangement by connecting at least two of said output terminals of said subsequent $g_m$ stages of said operational amplifier cells together.

21. The topology according to claim 18, wherein said at least one subsequent $g_m$ stage comprises a compensated stage.

22. The topology according to claim 18, wherein said at least one subsequent $g_m$ stage comprises a first subsequent stage and a second subsequent stage, and wherein said operational amplifier cells comprise second internal nodes configured between said first subsequent stages and said second subsequent stages that may be suitably directly connected together.

23. The topology according to claim 18, wherein said operational amplifier cells are selectively configurable in parallel through the use of a switching arrangement.

24. The topology according to claim 23, wherein said operational amplifier cells are selectively configurable in parallel through the use of programmable switches.

25. The topology according to claim 18, wherein said first $g_m$ stages comprise differential output stages connected to said at least one subsequent $g_m$ stages.

26. An operational amplifier having readily configurable input and output characteristics, said operational amplifier comprising:

a plurality of op amp cells having an input $g_m$ stage, a subsequent $g_m$ stage, and an internal node in between said input $g_m$ stage and said subsequent $g_m$ stage, wherein at least two of said op amp cells are configured in parallel arrangement by connecting together without the use of summing resistors said internal nodes of said at least two of said op amp cells.

* * * * *